(12) United States Patent
Kim

(10) Patent No.: US 10,921,846 B1
(45) Date of Patent: Feb. 16, 2021

(54) CLOCK GENERATION CIRCUIT OF SEMICONDUCTOR DEVICE

(71) Applicant: SK hynix Inc., Gyeonggi-do (KR)

(72) Inventor: Kwang-Soon Kim, Gyeonggi-do (KR)

(73) Assignee: SK hynix Inc., Gyeonggi-do (KR)

( * ) Notice: Subject to any disclaimer, the term of this patent is extended or adjusted under 35 U.S.C. 154(b) by 0 days.

(21) Appl. No.: 16/872,992

(22) Filed: May 12, 2020

(30) Foreign Application Priority Data

Dec. 12, 2019 (KR) .................. 10-2019-0165603

(51) Int. Cl.
| | |
|---|---|
| *G06F 1/06* | (2006.01) |
| *H03K 3/03* | (2006.01) |
| *H03K 3/037* | (2006.01) |
| *G06F 13/40* | (2006.01) |
| *H03K 19/20* | (2006.01) |
| *G06F 1/12* | (2006.01) |
| *H03K 5/00* | (2006.01) |

(52) U.S. Cl.
CPC .................. *G06F 1/06* (2013.01); *G06F 1/12* (2013.01); *G06F 13/4027* (2013.01); *H03K 3/0315* (2013.01); *H03K 3/0372* (2013.01); *H03K 5/00006* (2013.01); *H03K 19/20* (2013.01)

(58) Field of Classification Search
None
See application file for complete search history.

(56) References Cited

U.S. PATENT DOCUMENTS 5,357,217 A * 10/1994 Marchesi ............. H03K 3/0315
327/259
7,642,869 B2  1/2010 Fujii \* cited by examiner

*Primary Examiner* — Cassandra F Cox
(74) *Attorney, Agent, or Firm* — IP & T Group LLP

(57) ABSTRACT

A clock generation circuit includes: a preliminary clock generation circuit suitable for generating a first preliminary clock signal with a half of a target cycle, and generating a second preliminary clock signal by inverting the first preliminary clock signal; a clock doubler circuit suitable for generating first and second intermediate clock signals by respectively doubling the cycles of the first and second preliminary clock signals; and an edge trigger circuit suitable for triggering the first and second intermediate clock signals to output first and second output clock signals with the target cycle, respectively, according to the first and second preliminary clock signals.

20 Claims, 8 Drawing Sheets

CLOCK GENERATION CIRCUIT OF SEMICONDUCTOR DEVICE

CROSS-REFERENCE TO RELATED APPLICATION

The present application claims priority to Korean Patent Application No. 10-2019-0165603, filed on Dec. 12, 2019, which is incorporated herein by reference in its entirety.

BACKGROUND

1. Field

Various embodiments of the present invention relate to a clock generation circuit of a semiconductor device.

2. Description of the Related Art

Generally, a semiconductor device is configured to operate in synchronization with clock signals. The clock signals are generated either from the outside of the semiconductor device or from a clock generation circuit within the semiconductor device. In the semiconductor device, an oscillator circuit is generally used as a clock generation circuit for generating internal clocks without input from external clocks.

The existing oscillator circuit is composed of a ring oscillator that connects an odd number of inverters in series so that a final output may be fed back to an input of a first inverter. However, the ring oscillator has a disadvantage that a duty ratio of the output signal can be changed by the influence of a power voltage despite its simple structure. To improve this, a constant current source is coupled to the inverter of the ring oscillator, or circuits including a resistor, a capacitor and a Schmitt-trigger or a comparator are used to determine a period by an RC delay effect.

SUMMARY

Various embodiments are directed to a clock generation circuit and a semiconductor device capable of generating clock signals having a constant duty ratio.

In accordance with an embodiment of the present invention, a clock generation circuit may include: a preliminary clock generation circuit suitable for generating a first preliminary clock signal with a half of a target cycle, and generating a second preliminary clock signal by inverting the first preliminary clock signal; a clock doubler circuit suitable for generating first and second intermediate clock signals by respectively doubling the cycles of the first and second preliminary clock signals; and an edge trigger circuit suitable for triggering the first and second intermediate clock signals to output first and second output clock signals with the target cycle, respectively, according to the first and second preliminary clock signals.

In accordance with an embodiment of the present invention, a semiconductor device may include: a clock generation circuit suitable for generating first and second output clock signals with a target cycle, according to an enable signal; and a data input/output (I/O) circuit suitable for outputting or receiving data in synchronization with the first and second output clock signals, wherein the clock generation circuit includes: a preliminary clock generation circuit suitable for generating first and second preliminary clock signals with a half of the target cycle; a clock doubler circuit suitable for generating first and second intermediate clock signals by respectively doubling the cycles of the first and second preliminary clock signals; and an edge trigger circuit suitable for triggering the first and second intermediate clock signals to output the first and second output clock signals with the target cycle, respectively, according to the first and second preliminary clock signals.

In accordance with an embodiment of the present invention, a method for generating clock signals may include: generating first and second preliminary clock signals with a half of a target cycle; generating third and fourth preliminary clock signals by delaying the first and second preliminary clock signals, respectively; generating first and second intermediate clock signals by respectively doubling the cycles of the third and fourth preliminary clock signals; and triggering the first and second intermediate clock signals to output first and second output clock signals with the target cycle, respectively, at a first edge of the first preliminary clock signal.

In accordance with an embodiment of the present invention, a semiconductor system may include: a first semiconductor device suitable for operating as a master device; and a second semiconductor device suitable for operating as slave device, coupled to the first semiconductor device via a plurality of buses, wherein the plurality of buses convey control signals necessary for operations of the second semiconductor device from the first semiconductor device to the second semiconductor device, the first semiconductor device comprising: a preliminary clock generation circuit suitable for generating first and second preliminary clock signals with a half of a target cycle; a clock doubler circuit suitable for generating first and second intermediate clock signals by respectively doubling the cycles of the first and second preliminary clock signals; an edge trigger circuit suitable for triggering the first and second intermediate clock signals to output first and second output clock signals with the target cycle respectively, according to the first and second preliminary clock signals; a control circuit suitable for generating the control signals, according to the first and second output clock signals; and a data input/output circuit suitable for outputting or receiving data to/from the second semiconductor device in synchronization with the first and second output clock signals.

These and other features and advantages of the present disclosure will become apparent to those skilled in the art of the invention from the following detailed description in conjunction with the following drawings.

DETAILED DESCRIPTION

Figure 1A:
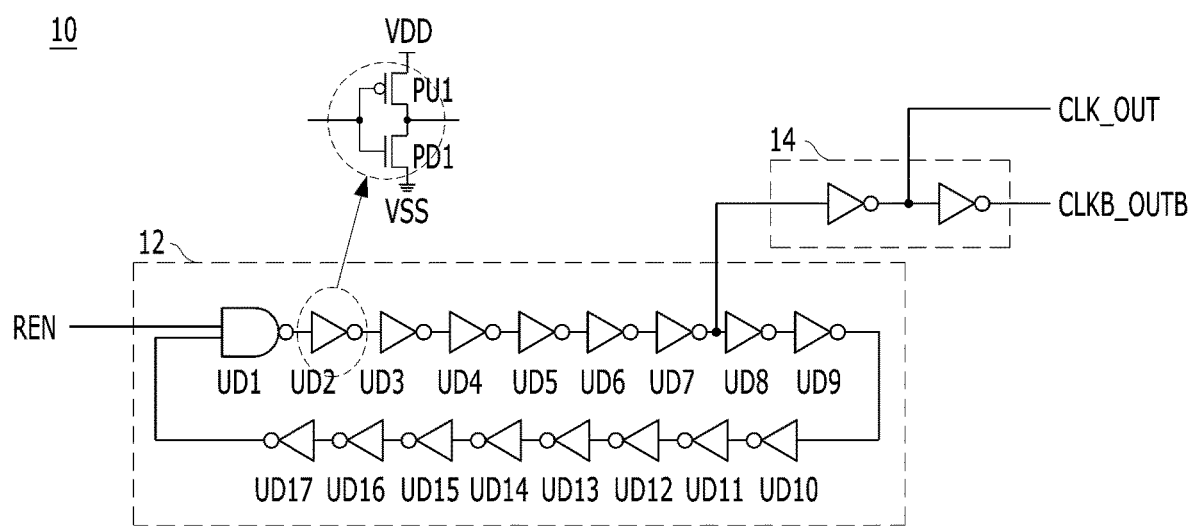
FIG. 1A illustrates a clock generation circuit using a conventional ring oscillator.

Various embodiments of the present invention are described below in more detail with reference to the accompanying drawings. The present invention may, however, be embodied in different forms and should not be construed as limited to the embodiments set forth herein. Rather, these embodiments are provided so that this disclosure is thorough and complete, and fully conveys the scope of the present invention to those skilled in the art. Throughout the disclosure, like reference numerals refer to like parts throughout the various figures and embodiments of the present invention. Also, throughout the specification, reference to "an embodiment" or the like is not necessarily to only one embodiment, and different references to any such phrase are not necessarily to the same embodiment(s).

Figure 1B:
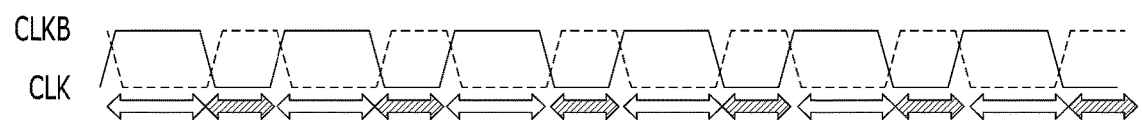
FIG. 1B illustrates waveform diagram showing clock signals generated by the clock generation circuit of FIG. 1A.

FIG. 1A is a circuit diagram illustrating a clock generation circuit 10 using a conventional ring oscillator 12, and FIG. 1B illustrates waveform diagram showing clock signals generated by the clock generation circuit of FIG. 1A.

Referring to FIG. 1A, the ring oscillator 12 may include an odd number of delay elements UD1 to UD17 coupled in series. The ring oscillator 12 may have a ring structure in which an output of the delay element UD17 located at a final stage is fed back to an input of the delay element UD1 located at a first stage. For example, in FIG. 1A, 17 delay elements UD1 to UD17 may be coupled in series, and each delay element may be implemented as an inverter. The ring oscillator 12 may be activated according to an enable signal REN. In order to receive the enable signal REN, the delay element UD1 at the first stage may be implemented as a NAND gate that serves as an inverter when the enable signal REN is activated to a logic high level.

The clock generation circuit 10 may further include a clock buffer 14 that receives an output signal of the ring oscillator 12 and generates a first output clock signal CLK_OUT and a second output clock signal CLKB_OUT, both of which have a target cycle. The clock buffer 14 may buffer any output signal from the delay elements UD1 to UD17 to generate the first output clock signal CLK_OUT, and invert the first output clock signal CLK_OUT to generate the second output clock signal CLKB_OUT. For example, in FIG. 1A, the first output clock signal CLK_OUT may originate from an output terminal of the delay element UD7 located at a seventh stage.

Moreover, each of the delay elements UD1 to UD17 may be composed of a pull-up transistor PU1 and a pull-down transistor PD1 coupled in series between a supply voltage (VDD) terminal and a ground voltage (VSS) terminal. In general, the characteristics of transistors may vary according to process, voltage, and temperature (PVT). For example, due to a mismatch among gate patterning processes for forming transistors included in the delay elements UD1 to UD17, or a difference in the amount of dose in an implantation process for determining a threshold voltage (Vth) of the transistors, the characteristics of transistors may be different from the original design intent. As a result, as shown in FIG. 1B, a duty ratio of the first output clock signal CLK_OUT and the second output clock signal CLKB_OUT may be distorted, and a cross-point therebetween may be off center. If an internal operation of a semiconductor device is performed using the first output clock signal CLK_OUT and the second output clock signal CLKB_OUT, an effective window width of a final output data may be narrowed due to a lack of margin between input and output data. As this effective window width becomes narrower with a high speed operation, it is increasingly important that the clock generation circuit 10 generates the first output clock signal CLK_OUT and the second output clock signal CLKB_OUT with a constant duty ratio and a centered cross-point.

Hereinafter, a method for generating a pair of output clocks whose duty ratio is constant regardless of the PVT variation and if the cross-point is centered, will be described.

Figure 2:
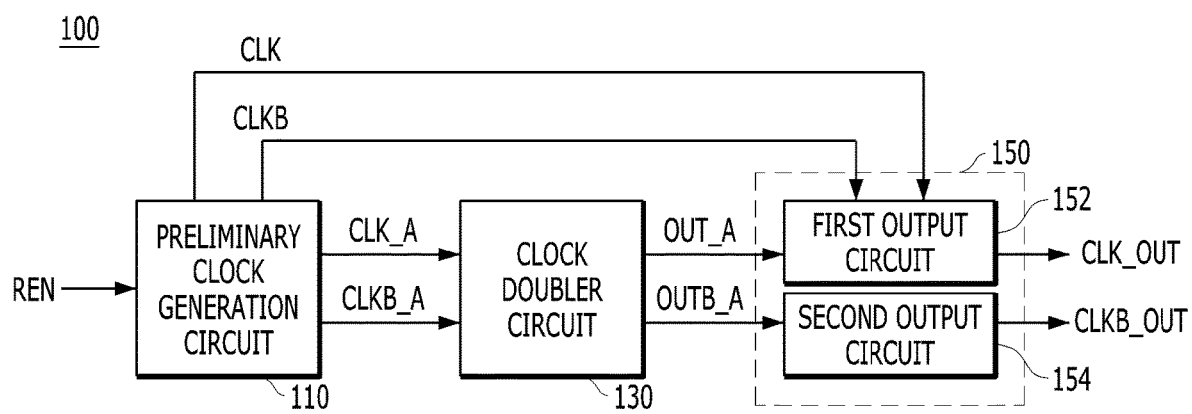
FIG. 2 is a block diagram illustrating a clock generation circuit in accordance with various embodiments of the present invention.

FIG. 2 is a block diagram illustrating a clock generation circuit 100 in accordance with an embodiment of the present invention.

Referring to FIG. 2, the clock generation circuit 100 may include a preliminary clock generation circuit 110, a clock doubler circuit 130, and an edge trigger circuit 150.

The preliminary clock generation circuit 110 may generate a first preliminary clock signal CLK with a half of the target cycle, and generate a second preliminary clock signal CLKB by inverting the first preliminary clock signal CLK. The preliminary clock generation circuit 110 may be activated in response to an enable signal REN. Further, the preliminary clock generation circuit 110 may output a third preliminary clock signal CLK_A and a fourth preliminary clock signal CLKB_A by respectively delaying the first preliminary clock signal CLK and the second preliminary clock signal CLK for a specified time period. According to an embodiment, the third preliminary clock signal CLK_A may be the same signal as the first preliminary clock signal CLK, and the fourth preliminary clock signal CLKB_A may be the same signal as the second preliminary clock signal CLKB. The detailed configuration of the preliminary clock generation circuit 110 will be described in FIG. 3.

The clock doubler circuit 130 may generate a first intermediate clock signal OUT_A and a second intermediate clock signal OUTB_A by respectively doubling a cycle of the third preliminary clock signal CLK_A and a cycle of the fourth preliminary clock signal CLKB_A. That is, the clock double circuit 130 may generate the first and second intermediate clock signals OUT_A and OUTB_A by respectively dividing a frequency of the third preliminary clock signal CLK_A by ½ and a frequency of the fourth preliminary clock signal CLKB_A by ½. At this time, since the third and fourth preliminary clock signals CLK_A and CLKB_A have a half of the target cycle, the clock doubler circuit 130 may generate the first intermediate clock signal OUT_A with the target cycle, and the second intermediate clock signal OUTB_A with the target cycle. The detailed configuration of the clock doubler circuit 130 will be described in FIGS. 4A and 4B.

The edge trigger circuit 150 may trigger the first intermediate clock signal OUT_A according to the first and second preliminary clock signals CLK and CLKB to output a first output clock signal CLK_OUT with the target cycle. The edge trigger circuit 150 may trigger the second intermediate clock signal OUTB_A according to the first and second preliminary clock signals CLK and CLKB to output a second output clock signal CLKB_OUT with the target cycle. Edge trigger circuit 150 may include a first output circuit 152 for outputting the first output clock signal CLK_OUT, and a second output circuit 154 for outputting the second output clock signal CLKB_OUT.

The first output circuit 152 may trigger the first intermediate clock signal OUT_A at a first edge (e.g., a rising edge) of the first preliminary clock signal CLK to output the first output clock signal CLK_OUT, and maintain a level of the first output clock signal CLK_OUT at a first edge (e.g., a rising edge) of the second preliminary clock signal CLKB. The second output circuit 154 may trigger the second intermediate clock signal OUTB_A at the first edge of the first preliminary clock signal CLK to output the second output clock signal CLKB_OUT, and maintain a level of the second output clock CLKB at the first edge of the second preliminary clock signal CLKB. The detailed configuration and operation of the first and second output circuits 152 and 154 are described in FIGS. 5A and 5B.

Figure 3:
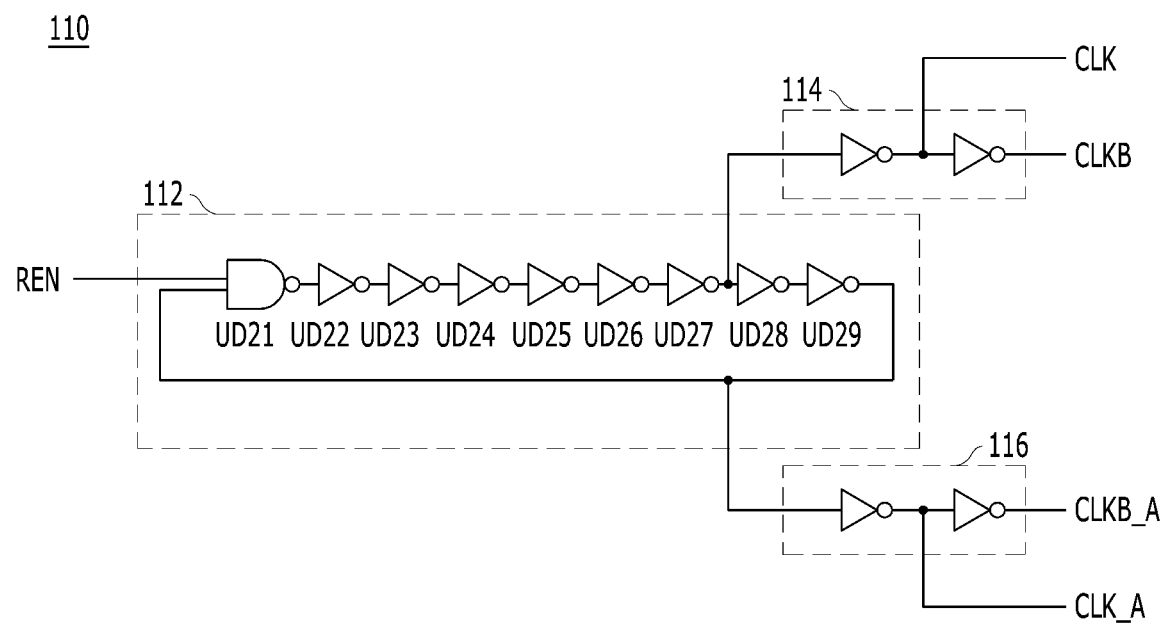
FIG. 3 is a circuit diagram illustrating a preliminary clock generation circuit of FIG. 2 in accordance with various embodiments of the present invention.

FIG. 3 is a circuit diagram illustrating the preliminary clock generation circuit 110 of FIG. 2.

Referring to FIG. 3, the preliminary clock generation circuit 110 may include a ring oscillator 112 including an odd number of delay elements UD21 to UD29 coupled to each other in series. The ring oscillator 112 may have a ring structure in which an output of the delay element UD29 located at a final stage is fed back to an input of the delay element UD21 located at a first stage. Each of the delay elements UD21 to UD29 may be implemented as an inverter. Each of the delay elements UD21 to UD29 may be composed of a pull-up transistor (PU1 of FIG. 1A) and a pull-down transistor (PD1 of FIG. 1A) coupled in series between a supply voltage (VDD) terminal and a ground voltage (VSS) terminal. The ring oscillator 112 may be activated according to an enable signal REN. In order to receive the enable signal REN, the delay element UD21 at the first stage may be implemented as a NAND gate that serves as an inverter when the enable signal REN is activated to a logic high level.

For reference, the ring oscillator 12 of FIG. 1A is connected in series with 17 delay elements UD1 to UD17, while the ring oscillator 112 of FIG. 3 is connected in series with 9 delay elements UD21 to UD29. In other words, the ring oscillator 12 of FIG. 1A is equipped with 17 delay elements to generate the first and second output clock signals CLK_OUT and CLKB_OUT with the target cycle, while the ring oscillator 112 of FIG. 3 may be equipped with 9 delay elements to generate the first and second preliminary clock signals CLK and CLKB with a half of the target cycle. Thus, the ring oscillator 112 of FIG. 3 may occupy half the area of the ring oscillator 12 of FIG. 1A.

The preliminary clock generation circuit 110 may further include a first clock buffer 114 and a second clock buffer 116. In an embodiment, each of the first clock buffer 114 and the second clock buffer 116 may be implemented with two inverters connected in series.

The first clock buffer 114 may generate the first and second preliminary clock signals CLK and CLKB based on an output signal of the ring oscillator 112. The first clock buffer 114 may buffer any output signal from the delay elements UD21 to UD29 to generate the first preliminary clock signal CLK, and generate the second preliminary clock signal CLKB by inverting the first preliminary clock signal CLK. The second clock buffer 116 may generate the third and fourth preliminary clock signals CLK_A and CLKB_A based on an output signal of the ring oscillator 112. The second clock buffer 116 may buffer any output signal from the delay elements UD21 to UD29 to generate the third preliminary clock signal CLK_A, and generate the fourth preliminary clock signal CLKB_A by inverting the third preliminary clock signal CLK_A. For example, in FIG. 3, the third preliminary clock signal CLK_A may originate from an output terminal of the ninth delay element UD29.

Moreover, in FIG. 3, the first preliminary clock signal CLK may originate from an output terminal of the seventh delay element UD27, and the third preliminary clock signal CLK_A may originate from the output terminal of the ninth delay element UD29. However, the proposed invention is not limited thereto. In an embodiment, the third preliminary clock signal CLK_A may originate from an output terminal of a certain delay element following the delay element from which the first preliminary clock signal CLK originated. In another embodiment, the first and third preliminary clock signals CLK and CLK_A may be the same signal which originated from the same output terminal. In the latter case, the third preliminary clock signal CLK_A may be the same signal as the first preliminary clock signal CLK, and the fourth preliminary clock signal CLKB_A may be the same signal as the second preliminary clock signal CLKB.

For reference, the first to fourth preliminary clock signals CLK, CLKB, CLK_A, CLKB_A generated by the preliminary clock generation circuit 110 may have a duty ratio that may be distorted due to the PVT variation, and the cross-points therebetween being off center. However, each of the first to fourth preliminary clock signals CLK, CLKB, CLK_A, CLKB_A may have a constant cycle.

Figure 4A:
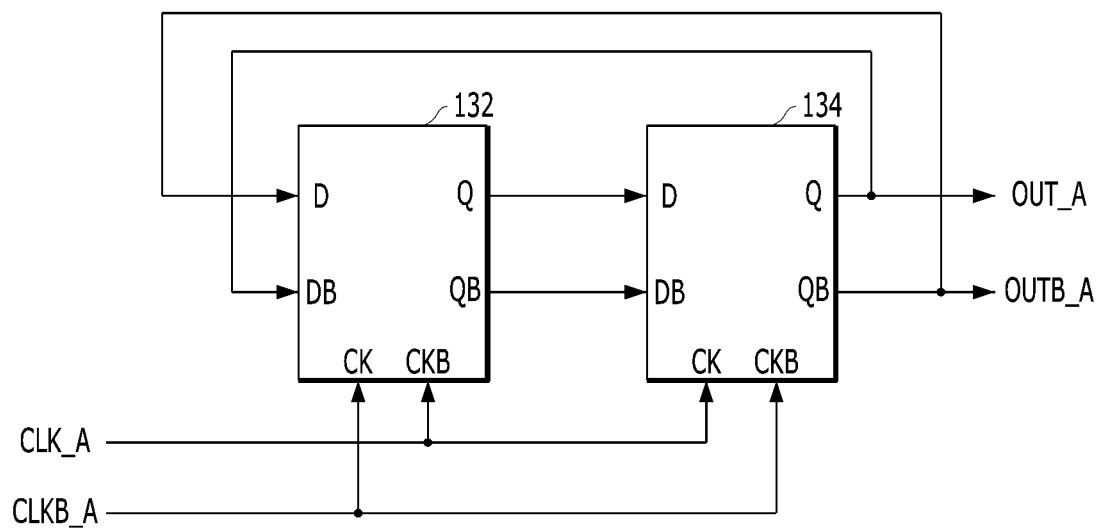
FIG. 4A illustrates a clock doubler circuit of FIG. 2 in accordance with various embodiments of the present invention.

FIG. 4A is a circuit diagram illustrating the clock doubler circuit 130 of FIG. 2.

Referring to FIG. 4A, the clock doubler circuit 130 may include a first flip-flop and a second flip-flop 134 coupled in series.

The first flip-flop 132 may receive the third preliminary clock signal CLK_A through a clock bar terminal (CKB), the fourth preliminary clock signal CLKB_A through a clock terminal (CK), the first intermediate clock signal OUT_A through an input bar terminal (DB) and the second intermediate clock signal OUTB_A through an input terminal (D). The second flip-flop 134 may receive the third preliminary clock signal CLK_A through a clock terminal (CK), the fourth preliminary clock signal CLKB_A through a clock bar terminal (CKB), a signal from an output terminal (Q) of the first flip-flop (132) through an input terminal (D), and a signal from an output bar terminal (QB) of the first flip-flop (132) through an input bar terminal (DB). Finally, the second flip-flop (134) may output the first intermediate clock signal OUT_A through its output terminal (Q), and output the second intermediate clock signal OUTB_A through its output bar terminal (QB).

Figure 4B:
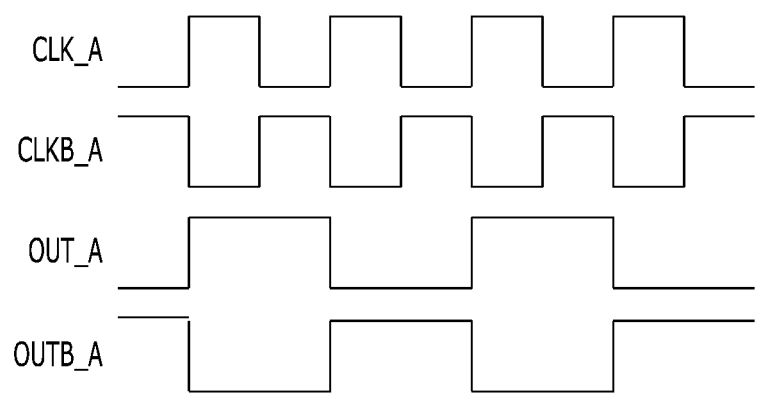
FIG. 4B illustrates waveform diagram showing clock signals generated by the clock doubler circuit of FIG. 4A.

FIG. 4B is a timing diagram illustrating an operation of the clock doubler circuit 130 of FIG. 2. The timing diagram of FIG. 4B is an example in which there is no delay at rising and falling times of each clock signal.

Referring to FIG. 4B, the first flip-flop 132 may latch the second intermediate clock signal OUTB_A inputted to the input terminal (D), at a first edge (e.g., a rising edge) of the fourth preliminary clock signal CLKB_A. The second flip-flop 134 may latch the signal from the output terminal (Q) of the first flip-flop 132, inputted to its input terminal (D), at a first edge (e.g., a rising edge) of the third preliminary clock signal CLK_A, to output the first intermediate clock signal OUT_A to its output terminal (Q). The second flip-flop 134 may latch the signal from the output bar terminal (QB) of the first flip-flop 132, inputted to its input bar terminal (DB), at the first edge of the third preliminary clock signal CLK_A, to output the second intermediate clock signal OUTB_A to its output bar terminal (QB).

As a result, the first intermediate clock signal OUT_A and the second intermediate clock signal OUTB_A may be toggled for each rising edge (i.e., every one cycle) of the third preliminary clock signal CLK_A. In other words, the clock doubler circuit 130 may generate the first and second intermediate clock signals OUT_A and OUTB_A with the target cycle by receiving the third and fourth preliminary clock signals CLK_A and CLKB_A with a half of the target cycle, respectively.

Figure 5A:
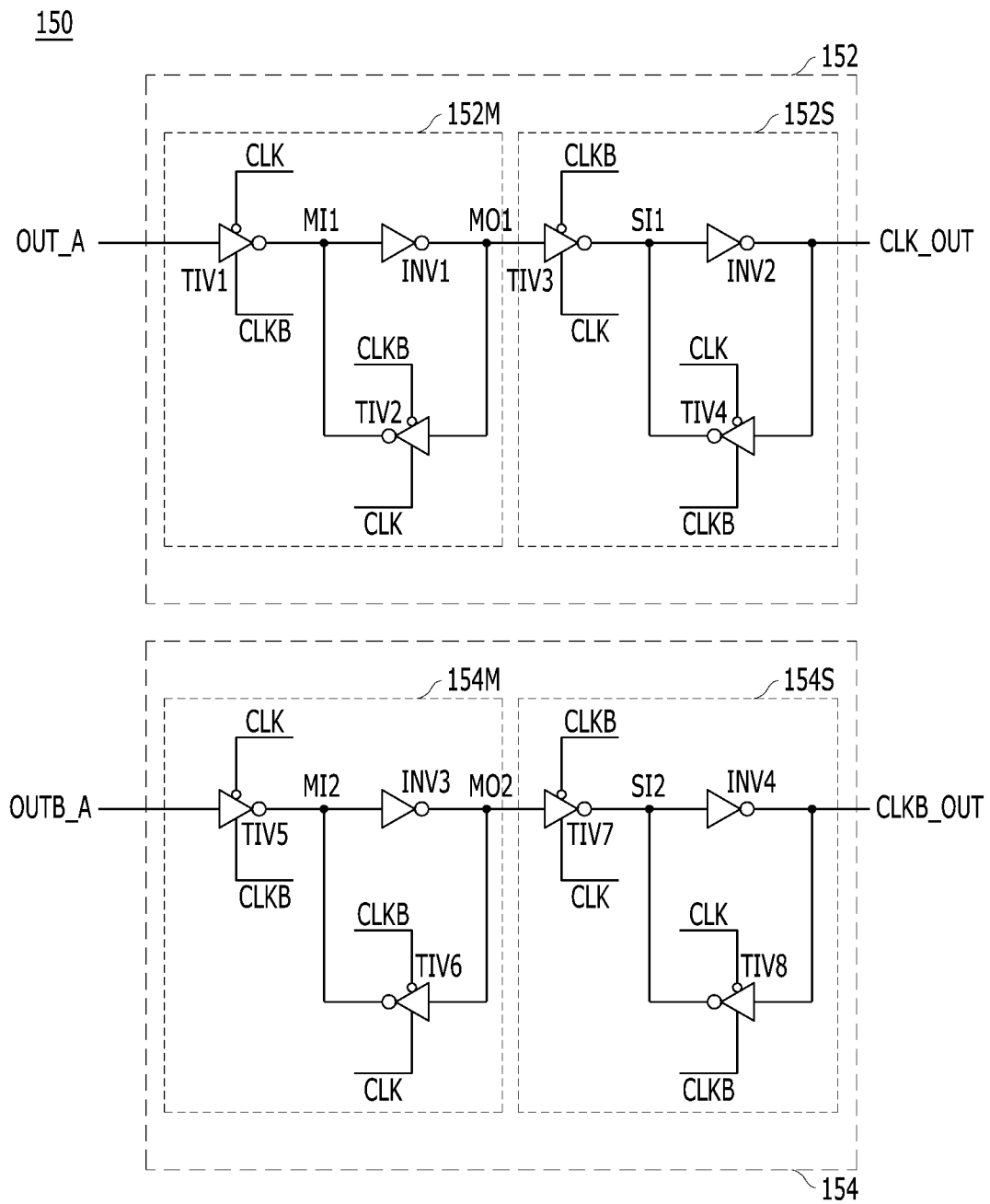
FIG. 5A is a circuit diagram illustrating an edge trigger circuit of FIG. 2 in accordance with various embodiments of the present invention.

FIG. 5A is a circuit diagram illustrating the edge trigger circuit 150 of FIG. 2.

Referring to FIG. 5A, the first output circuit 152 of the edge trigger circuit 150 may include a first master latch circuit 152M and a first slave latch circuit 152S.

The first master latch circuit 152M may receive the first intermediate clock signal OUT_A to output a first master output signal MO1, under a first condition where the first preliminary clock signal CLK has a logic low level and the second preliminary clock signal CLKB has a logic high level. The first master latch circuit 152M may latch the first master output signal MO1 under a second condition where the first preliminary clock signal CLK has a logic high level and the second preliminary clock signal CLKB has a logic low level. More specifically, the first master latch circuit 152M may include a first tri-state inverter TIV1, a first inverter INV1 and a second tri-state inverter TIV2.

The first tri-state inverter TIV1 may output a first master input signal MI1 by inverting the first intermediate clock signal OUT_A, under the first condition. The first tri-state inverter TIV1 may isolate an input of the first master latch circuit 152M from an input of the first inverter INV1, under the second condition. The first inverter INV1 may be coupled to an output terminal of the first tri-state inverter TIV1 to invert the first master input signal MI1 to output the first master output signal MO1. The second tri-state inverter TIV2 may be cross-coupled to the first inverter INV1. The second tri-state inverter TIV2 may be coupled between an output terminal of the first inverter INV1 and the output terminal of the first tri-state inverter TIV1. The second tri-state inverter TIV2 may output the first master input signal MI1 by inverting the first master output signal MO1, under the second condition. The first inverter INV1 and the second tri-state inverter TIV2 may constitute an inverter latch. That is, the first inverter INV1 and the second tri-state inverter TIV2 may serve as an inverter latch under the second condition, and may serve as an inverter under the first condition.

The first slave latch circuit 152S may receive the first master output signal MO1 to output the first output clock signal CLK_OUT, under the second condition. The first slave latch circuit 152S may latch the first output clock signal CLK_OUT under the first condition. More specifically, the first slave latch circuit 152S may include a third tri-state inverter TIV3, a second inverter INV2 and a fourth tri-state inverter TIV4.

The third tri-state inverter TIV3 may be coupled to an output terminal of the first master latch circuit 152M, i.e., an output of the first inverter INV1. The third tri-state inverter TIV3 may output a first slave input signal SI1 by inverting the first master output signal MO1, under the second condition. The third tri-state inverter TIV3 may isolate the output of the first master latch circuit 152M from an input of the second inverter INV2, under the first condition. The second inverter INV2 may be coupled to an output terminal of the third tri-state inverter TIV3 to invert the first slave input signal SI1 to output the first output clock signal CLK_OUT. The fourth tri-state inverter TIV4 may be cross-coupled to the second inverter INV2. The fourth tri-state inverter TIV4 may be coupled between an output terminal of the second inverter INV2 and the output terminal of the third tri-state inverter TIV3. The fourth tri-state inverter TIV4 may output the first slave input signal SI1 by inverting the first output clock signal CLK_OUT, under the first condition. The second inverter INV2 and the fourth tri-state inverter TIV4 may constitute an inverter latch. That is, the second inverter INV2 and the fourth tri-state inverter TIV4 may serve as an inverter latch under the first condition, and may serve as an inverter under the second condition.

Moreover, the second output circuit 154 of the edge trigger circuit 150 may include a second master latch circuit 154M and a second slave latch circuit 154S.

The second master latch circuit 154M may receive the second intermediate clock signal OUTB_A to output a second master output signal MO2, under the first condition. The second master latch circuit 154M may latch the second master output signal MO2 under the second condition. More specifically, the second master latch circuit 154M may include a fifth tri-state inverter TIV5, a third inverter INV3 and a sixth tri-state inverter TIV6.

The fifth tri-state inverter TIV5 may output a second master input signal MI2 by inverting the second intermediate clock signal OUTB_A, under the first condition. The fifth tri-state inverter TIV5 may isolate an input of the second master latch circuit 154M from an input of the third inverter INV3, under the second condition. The third inverter INV3 may be coupled to an output terminal of the fifth tri-state inverter TIV5 to invert the second master input signal MI2 to output the second master output signal MO2. The sixth tri-state inverter TIV6 may be cross-coupled to the third inverter INV3. The sixth tri-state inverter TIV6 may be coupled between an output terminal of the third inverter INV3 and the output terminal of the fifth tri-state inverter TIV5. The sixth tri-state inverter TIV6 may output the second master input signal MI2 by inverting the second master output signal MO2, under the second condition. The third inverter INV3 and the sixth tri-state inverter TIV6 may constitute an inverter latch. That is, the third inverter INV3 and the sixth tri-state inverter TIV6 may serve as an inverter latch under the second condition, and may serve as an inverter under the first condition.

The second slave latch circuit 154S may receive the second master output signal MO2 to output the second output clock signal CLKB_OUT, under the second condition. The second slave latch circuit 154S may latch the second output clock signal CLKB_OUT under the first condition. More specifically, the second slave latch circuit 154S may include a seventh tri-state inverter TIV7, a fourth inverter INV4 and an eighth tri-state inverter TIV8.

The seventh tri-state inverter TIV7 may be coupled to an output terminal of the second master latch circuit 154M, i.e., an output of the third inverter INV3. The seventh tri-state inverter TIV7 may output a second slave input signal SI2 by inverting the second master output signal MO2, under the second condition. The seventh tri-state inverter TIV7 may isolate the output of the second master latch circuit 154M from an input of fourth inverter INV4, under the first condition. The fourth inverter INV4 may be coupled to an output terminal of the seventh tri-state inverter TIV7 to invert the second slave input signal SI2 to output the second output clock signal CLKB_OUT. The eighth tri-state inverter TIV8 may be cross-coupled to the fourth inverter INV4. The eighth tri-state inverter TIV8 may be coupled between an output terminal of the fourth inverter INV4 and the output terminal of the seventh tri-state inverter TIV7.

The eighth tri-state inverter TIV8 may output the second slave input signal SI2 by inverting the second output clock signal CLKB_OUT, under the first condition. The fourth inverter INV4 and the eighth tri-state inverter TIV8 may constitute an inverter latch. That is, the fourth inverter INV4 and the eighth tri-state inverter TIV8 may serve as an inverter latch under the first condition, and may serve as an inverter under the second condition.

Figure 5B:
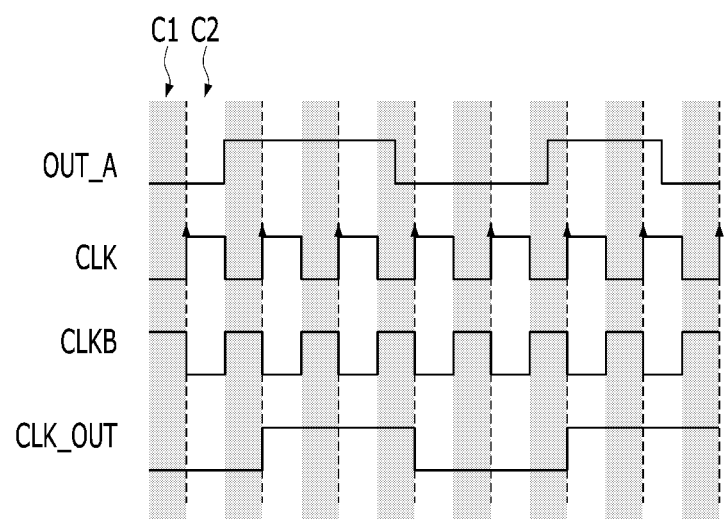
FIG. 5B is a timing diagram showing an operation of a first output circuit of the edge trigger circuit of FIG. 2 in accordance with various embodiments of the present invention.

FIG. 5B is a timing diagram describing an operation of the first output circuit 152 of the edge trigger circuit 150 of FIG. 2. The second output circuit 154 may perform substantially the same operation as the first output circuit 152. Figure FIG. 5B illustrates an example in which there is no delay at rising and falling times of each clock signal and there is no delay by each inverter.

Referring to FIG. 5B, a first condition C1 (shadowed) where the first preliminary clock signal CLK has a logic low level and the second preliminary clock signal CLKB has a logic high level, and a second condition C2 where the first preliminary clock signal CLK has a logic high level and the second preliminary clock signal CLKB has a logic low level, are shown.

Under the first condition C1, the first master latch circuit 152M may receive the first intermediate clock signal OUT_A and output it as the first master output signal MO1. Thereafter, at a moment of transition from the first condition C1 to the second condition C2, i.e., at a rising edge of the first preliminary clock signal CLK, the first master latch circuit 152M may latch the first master output signal MO1, and the first slave latch circuit 152S may output the first master output signal MO1 as the first output clock signal CLK_OUT.

Accordingly, the first output circuit 152 of the edge trigger circuit 152 may trigger the first intermediate clock signal OUT_A at the rising edge of the first preliminary clock signal CLK to output the first output clock signal CLK_OUT, and maintain a level of the first output clock signal CLK_OUT at a rising edge of the second preliminary clock signal CLKB.

Hereinafter, referring to FIGS. 2 to 6, a method for generating the clock signal will be described.

Figure 6:
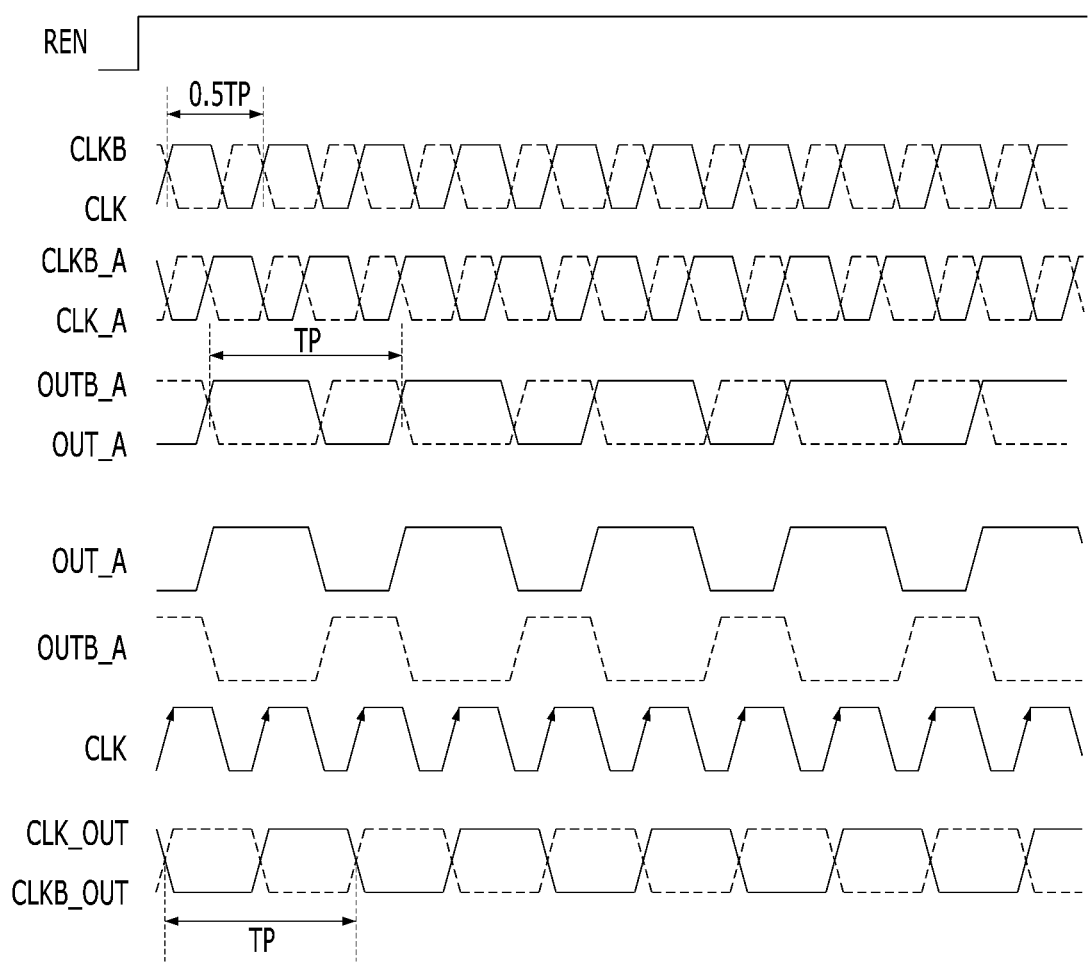
FIG. 6 is a timing diagram showing an operation of a clock generation circuit in accordance with various embodiments of the present invention.

FIG. 6 is a timing diagram describing an operation of a clock generation circuit in accordance with various embodiments of the present invention.

Referring to FIG. 6, when the enable signal REN is activated to a logic high level, the preliminary clock generation circuit 110 may generate the first preliminary clock signal CLK with a half (0.5TP) of the target cycle (TP), and invert the first preliminary clock signal CLK to generate the second preliminary clock signal CLKB. Further, the preliminary clock generation circuit 110 may output the third preliminary clock signal CLK_A and the fourth preliminary clock signal CLKB_A, by respectively delaying the first preliminary clock signal CLK and the second preliminary clock signal CLKB. In this case, the characteristics of the pull-up transistor PU1 and the pull-down transistor PD1 placed within each of the delay elements UD21 to UD29 of the ring oscillator 112 may be changed due to the PVT variation. As a result, the duty ratio of the first output clock signal CLK_OUT and the second output clock signal CLKB_OUT may be distorted and a cross-point therebetween may be off center. Similarly, the duty ratio of the third preliminary clock signal CLK_A and the fourth preliminary clock signal CLKB_A may be distorted, and a cross-point therebetween may be off center. At this time, each of the first to fourth preliminary clock signals CLK, CLKB, CLK_A and CLKB_A has a constant cycle.

The clock doubler circuit 130 may generate the first and second intermediate clock signals OUT_A and OUTB_A by doubling the cycles of the third preliminary clock signal CLK_A and the fourth preliminary clock signal CLKB_A, respectively. At this point, since the third preliminary clock signal CLK_A and the fourth preliminary clock signal CLKB_A have half (0.5TP) of the target cycle (TP), the clock doubler circuit 130 may generate the first intermediate clock signal OUT_A and the second intermediate clock OUTB_A with the target cycle (TP). The detailed operation of the clock doubler circuit 130 is described in FIG. 4B.

The first output circuit 152 of the edge trigger circuit 150 may trigger the first intermediate clock signal OUT_A at a rising edge of the first preliminary clock signal CLK to output the first output clock signal CLK_OUT. The second output circuit 154 may trigger the second intermediate clock signal OUTB_A at a rising edge of the first preliminary clock signal CLK to output the second output clock signal CLKB_OUT. The detailed operation of the first output circuit 152 and the second output circuit 154 is described in FIG. 5B.

As described above, the clock generation circuit 100 in accordance with various embodiments of the present invention may take advantage of the fact that a duty ratio of clock signals generated by an oscillator output may not be 50:50, while the clock signals may have a constant cycle. In other words, the clock generation circuit 100 may generate preliminary clock signals having a half of a target cycle, and then trigger the preliminary clock signals using intermediate clock signals which are generated by doubling the cycle of the preliminary clock signals, thereby outputting the first and second output clock signals CLK_OUT and CLKB_OUT. As illustrated in FIG. 6, the final output clock signals CLK_OUT and CLKB_OUT may have a constant duty ratio and a cross-point therebetween is centered regardless of the PVT variation. Accordingly, the skew between the clock signal and the data can be reduced, and the effective width of the data can be obtained to ensure high speed operation.

Figure 7:
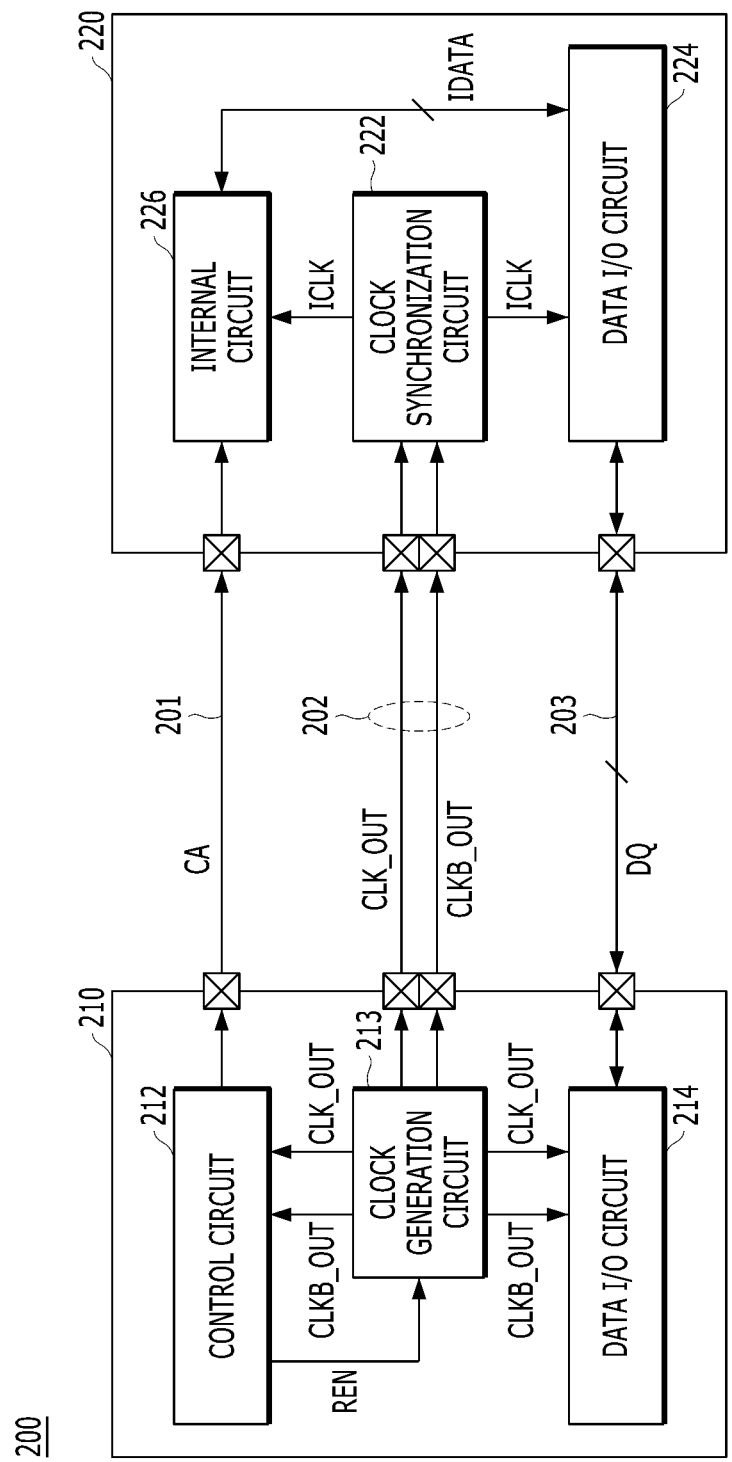
FIG. 7 is a block diagram illustrating a semiconductor system in which a clock generation circuit is embedded, in accordance with various embodiments of the present invention.

FIG. 7 is a block diagram illustrating a semiconductor system 200 in which a clock generation circuit 213 is embedded, in accordance with various embodiments of the present invention. In FIG. 7, the clock generation circuit 100 of FIG. 1 may be implemented as the clock generation circuit 213.

Referring to FIG. 7, the semiconductor system 200 may include a first semiconductor device 210 and a second semiconductor device 220. The first semiconductor device 210 may operate as a master device and the second semiconductor device 220 may operate as a slave device. The first semiconductor device 210 may provide various control signals (e.g., command/address CA and clock signals CLK_OUT and CLKB_OUT), which are required for an operation of the second semiconductor device 220. The first semiconductor device 210 may be a host device such as a CPU, a graphics processing unit (GPU), a multi-media processor (MMP), a digital signal processor (DSP), an application processor (AP), and a memory controller. In addition, the first semiconductor device 210 may be a test device or test equipment for testing the second semiconductor device 220. The second semiconductor device 220 may be a memory device, and the memory device may include a volatile memory and a non-volatile memory. In an embodiment, both the first semiconductor device 210 and the second semiconductor device 220 may be memory devices.

The first semiconductor device 210 may be coupled to the second semiconductor device 220 via a plurality of buses.

The buses may serve as signal transmission paths, links, or channels for transmitting signals. The buses may include a command/address bus 201 for transmitting the command/address CA, a clock bus 202 for transmitting the clock signals CLK_OUT and CLKB_OUT, and a data bus 203 for transmitting data DQ. The command/address bus 201 and the clock bus 202 may be a one-way bus and the data bus 203 may be a two-way bus. The clock bus 202 may include a pair of buses to transmit complimentary clock signals. The complimentary clock signals may include a first output clock signal CLK_OUT and a second output clock signal CLKB_OUT.

The first semiconductor device 210 may include a control circuit 212, a clock generation circuit 213, and a data input/output (I/O) circuit 214. The control circuit 212 may generate the control signals necessary for the operation of the second semiconductor device 220, according to the first output clock signal CLK_OUT and the second output clock signal CLKB_OUT, and transfer the command/address CA to the command/address bus 201. The control circuit 212 may generate various control signals, but in the proposed invention, only an enable signal REN to activate the clock generation circuit 213 will be described.

The clock generation circuit 213 may have substantially the same configuration and operation as the clock generation circuit 100 in FIGS. 2 to 6. In other words, the clock generation circuit 213 may generate the first and second preliminary clock signals CLK and CLKB with a half (0.5TP) of a target cycle (TP) when the enable signal REN is activated. The clock generation circuit 213 may generate the first and second intermediate clock signals OUT_A and OUTB_A by respectively doubling the cycles of the third and fourth preliminary clock signals CLK_A and CLKB_A, both of which are generated by respectively delaying the first and second preliminary clock signals CLK and CLKB. The clock generation circuit 213 may trigger first and second intermediate clock signals OUT_A and OUTB_A at the rising edge of the first preliminary clock signal CLK to output the first and second output clock signals CLK_OUT and CLB_OUT. Therefore, the first and second output clock signals CLK_OUT and CLB_OUT may have a constant duty ratio and a cross-point therebetween may be centered. The data I/O circuit 214 may perform data I/O operations in synchronization with the first and second output clock signals CLK_OUT and CLKB_OUT.

The second semiconductor device 220 may include a clock synchronization circuit 222, a data input/output (I/O) circuit 224, and an internal circuit 226. The clock synchronization circuit 222 may be coupled to the clock bus 202 via a clock pad and receive the first and second output clock signals CLK_OUT and CLKB_OUT to generate an internal clock signal ICLK. The clock synchronization circuit 222 may be implemented as a delay locked loop (DLL) or phase locked loop (DLL) for synchronizing the internal clock signal ICLK with an external clock signal (i.e., the first and second output clock signals CLK_OUT and CLKB_OUT) in order to compensate for the time delay caused by the internal circuit 226 when the first and second output clock signals CLK_OUT and CLKB_OUT provided from the outside are used internally. The data I/O circuit 224 may be coupled to the data bus 203 through a data pad, and receive the data DQ from the first semiconductor device 210 or transmit the data DQ to the first semiconductor device 210. The data I/O circuit 224 may perform data I/O operations in synchronization with the internal clock signal ICLK generated by the clock synchronization circuit 222. The data I/O circuit 224 may receive and transmit internal data IDATA containing read or write data from/to the internal circuit 226. The internal circuit 226 may be coupled to the command/address bus 201 via a CA pad, and receive the command/address CA transmitted from the first semiconductor device 210. The internal circuit 226 may perform operations corresponding to the command/address CA according to the internal clock signal ICLK. For example, the internal circuit 226 may perform a read operation on a memory cell to read out the data or a write operation on the memory cells to write the data.

As described above, in the clock generation circuit in accordance with various embodiments of the present invention, it is possible to reduce skew between clock signals and data by generating final output clock signals having a constant duty ratio and a centered cross-point regardless of the PVT variation. Further, the skew between the clock signal and the data is reduced, and the effective width of the data can be obtained to ensure high speed operation.

While the present invention has been described with respect to the specific embodiments, it will be apparent to those skilled in the art that various changes and modifications may be made without departing from the spirit and scope of the invention as defined in the following claims.

For example, the positions and the types of the logic gates and the transistor in the aforementioned embodiments can be differentially realized according to the polarity of an inputted signal.

What is claimed is:

1. A clock generation circuit comprising:
    a preliminary clock generation circuit suitable for generating a first preliminary clock signal with a half of a target cycle, and generating a second preliminary clock signal by inverting the first preliminary clock signal;
    a clock doubler circuit suitable for generating first and second intermediate clock signals by respectively doubling the cycles of the first and second preliminary clock signals; and
    an edge trigger circuit suitable for triggering the first and second intermediate clock signals to output first and second output clock signals with the target cycle, respectively, according to the first and second preliminary clock signals.

2. The clock generation circuit of claim 1, wherein the preliminary clock generation circuit includes:
    a ring oscillator including an odd number of delay elements coupled in series, and having a ring structure in which an output of the delay element located at a final stage is fed back to an input of the delay element located at a first stage.

3. The clock generation circuit of claim 1, wherein the clock doubler circuit includes:
    a first flip-flop suitable for receiving the first preliminary clock signal through a clock bar terminal, the second preliminary clock signal through a clock terminal, the first intermediate clock signal through an input bar terminal, and the second intermediate clock signal through an input terminal; and
    a second flip-flop suitable for receiving the first preliminary clock signal through a clock terminal, the second preliminary clock signal through a clock bar terminal, a signal from an output terminal of the first flip-flop through an input terminal, and a signal from an output bar terminal of the first flip-flop through an input bar terminal, and outputting the first intermediate clock signal through an output terminal, and the second intermediate clock signal through an output bar terminal.

4. The clock generation circuit of claim 1, wherein the edge trigger circuit includes:
   a first output circuit suitable for triggering the first intermediate clock signal at a first edge of the first preliminary clock signal to output the first output clock signal, and maintaining a level of the first output clock signal at the first edge of the second preliminary clock signal; and
   a second output circuit suitable for triggering the second intermediate clock signal at the first edge of the first preliminary clock signal to output the second output clock signal, and maintaining a level of the second output clock at the first edge of the second preliminary clock signal.

5. The clock generation circuit of claim 4, wherein the first output circuit includes:
   a first master latch circuit suitable for receiving the first intermediate clock signal to output a first master output signal under a first condition where the first preliminary clock signal has a first logic level and the second preliminary clock signal has a second logic level, wherein the second logic level corresponds to an inversion of the first logic level, and latching the first master output signal under a second condition where the first preliminary clock signal has the second logic level and the second preliminary clock signal has the first logic level; and
   a first slave latch circuit suitable for receiving the first master output signal to output the first output clock signal under the second condition, and latching the first output clock signal under the first condition.

6. The clock generation circuit of claim 5, wherein the first master latch circuit includes:
   a first tri-state inverter suitable for outputting a first master input signal by inverting the first intermediate clock signal under the first condition;
   a first inverter coupled to an output terminal of the first tri-state inverter and suitable for inverting the first master input signal to output the first master output signal; and
   a second tri-state inverter coupled between an output terminal of the first inverter and the output terminal of the first tri-state inverter and suitable for outputting the first master input signal by inverting the first master output signal under the second condition.

7. The clock generation circuit of claim 5, wherein the first slave latch circuit includes:
   a third tri-state inverter coupled to an output terminal of the first master latch circuit and suitable for outputting a first slave input signal by inverting the first master output signal under the second condition;
   a second inverter coupled to an output terminal of the third tri-state inverter and suitable for inverting the first slave input signal to output the first output clock signal; and
   a fourth tri-state inverter coupled between an output terminal of the second inverter and the output terminal of the third tri-state inverter and suitable for outputting the first slave input signal by inverting the first output clock signal under the first condition.

8. The clock generation circuit of claim 4, wherein the second output circuit includes:
   a second master latch circuit suitable for receiving the second intermediate clock signal to output a second master output signal under a first condition where the first preliminary clock signal has a first logic level and the second preliminary clock signal has a second logic level, wherein the second logic level corresponds to an inversion of the first logic level and latching the second master output signal under a second condition where the first preliminary clock signal has the second logic level and the second preliminary clock signal has the first logic level; and
   a second slave latch circuit suitable for receiving the second master output signal to output the second output clock signal under the second condition, and latching the second output clock signal under the first condition.

9. The clock generation circuit of claim 8, wherein the second master latch circuit includes:
   a fifth tri-state inverter suitable for outputting a second master input signal by inverting the second intermediate clock signal under the first condition;
   a third inverter coupled to an output terminal of the fifth tri-state inverter and suitable for inverting the second master input signal to output the second master output signal; and
   a sixth tri-state inverter coupled between an output terminal of the third inverter and the output terminal of the fifth tri-state inverter and suitable for outputting the second master input signal by inverting the second master output signal under the second condition.

10. The clock generation circuit of claim 8, wherein the second slave latch circuit includes:
    a seventh tri-state inverter coupled to an output terminal of the second master latch circuit and suitable for outputting a second slave input signal by inverting the second master output signal under the second condition;
    a fourth inverter coupled to an output terminal of the seventh tri-state inverter and suitable for inverting the second slave input signal to output the second output clock signal; and
    an eighth tri-state inverter coupled between an output terminal of the fourth inverter and the output terminal of the seventh tri-state inverter and suitable for outputting the second slave input signal by inverting the second output clock signal under the first condition.

11. A semiconductor device comprising:
    a clock generation circuit suitable for generating first and second output clock signals with a target cycle, according to an enable signal; and
    a data input/output (I/O) circuit suitable for outputting or receiving data in synchronization with the first and second output clock signals,
    wherein the clock generation circuit includes:
       a preliminary clock generation circuit suitable for generating first and second preliminary clock signals with a half of the target cycle;
       a clock doubler circuit suitable for generating first and second intermediate clock signals by respectively doubling the cycles of the first and second preliminary clock signals; and
       an edge trigger circuit suitable for triggering the first and second intermediate clock signals to output the first and second output clock signals with the target cycle, respectively, according to the first and second preliminary clock signals.

12. The semiconductor device of claim 11, wherein the edge trigger circuit includes:
    a first master latch circuit suitable for receiving the first intermediate clock signal to output a first master output signal under a first condition where the first preliminary clock signal has a first logic level and the second preliminary clock signal has a second logic level, wherein the second logic level corresponds to an inversion of the first logic level, and latching the first master output signal under a second condition where the first preliminary clock signal has the second logic level and the second preliminary clock signal has the first logic level;
a first slave latch circuit suitable for receiving the first master output signal to output the first output clock signal under the second condition, and latching the first output clock signal under the first condition;
a second master latch circuit suitable for receiving the second intermediate clock signal to output a second master output signal under the first condition, and latching the second master output signal under the second condition; and
a second slave latch circuit suitable for receiving the second master output signal to output the second output clock signal under the second condition, and latching the second output clock signal under the first condition.

13. A method for generating clock signals, comprising:
generating first and second preliminary clock signals with a half of a target cycle;
generating third and fourth preliminary clock signals by delaying the first and second preliminary clock signals, respectively;
generating first and second intermediate clock signals by respectively doubling the cycles of the third and fourth preliminary clock signals; and
triggering the first and second intermediate clock signals to output first and second output clock signals with the target cycle, respectively, at a first edge of the first preliminary clock signal.

14. The method of claim 13, wherein the outputting the first output clock signal includes:
receiving the first intermediate clock signal to output a first master output signal under a first condition where the first preliminary clock signal has a first logic level and the second preliminary clock signal has a second logic level, wherein the second logic level corresponds to an inversion of the first logic level; and
receiving the first master output signal to output the first output clock signal under a second condition where the first preliminary clock signal has the second logic level and the second preliminary clock signal has the first logic level.

15. The method of claim 13, wherein the outputting the second output clock signal includes:
receiving the second intermediate clock signal to output a second master output signal under a first condition where the first preliminary clock signal has a first logic level and the second preliminary clock signal has a second logic level, wherein the second logic level corresponds to an inversion of the first logic level; and
receiving the second master output signal to output the second output clock signal under a second condition where the first preliminary clock signal has the second logic level and the second preliminary clock signal has the first logic level.

16. A semiconductor system comprising:
a first semiconductor device suitable for operating as a master device; and
a second semiconductor device suitable for operating as slave device, coupled to the first semiconductor device via a plurality of buses, wherein the plurality of buses convey control signals necessary for operations of the second semiconductor device from the first semiconductor device to the second semiconductor device,
the first semiconductor device comprising:
a preliminary clock generation circuit suitable for generating first and second preliminary clock signals with a half of a target cycle;
a clock doubler circuit suitable for generating first and second intermediate clock signals by respectively doubling the cycles of the first and second preliminary clock signals;
an edge trigger circuit suitable for triggering the first and second intermediate clock signals to output first and second output clock signals with the target cycle respectively, according to the first and second preliminary clock signals;
a control circuit suitable for generating the control signals, according to the first and second output clock signals; and
a data input/output circuit suitable for outputting or receiving data to/from the second semiconductor device in synchronization with the first and second output clock signals.

17. The semiconductor system of claim 16, wherein the first semiconductor device includes at least one of a CPU, a graphics processing unit, a multi-media processor, a digital signal processor, an application processor and a memory controller.

18. The semiconductor system of claim 16, wherein the first semiconductor device comprises a test device or test equipment for testing the second semiconductor device.

19. The semiconductor system of claim 16, wherein the second semiconductor device comprises at least one of a volatile memory and a non-volatile memory.

20. The semiconductor system of claim 16, wherein the plurality of buses includes a command/address bus for transmitting a command/address, a clock bus for transmitting the first and second output clock signals and a data bus for transmitting data.

* * * * *